US 9,478,423 B2

(12) United States Patent
Takahashi et al.

(10) Patent No.: US 9,478,423 B2
(45) Date of Patent: Oct. 25, 2016

(54) METHOD OF VAPOR-DIFFUSING IMPURITIES

(71) Applicant: TOKYO ELECTRON LIMITED, Tokyo (JP)

(72) Inventors: Kazuya Takahashi, Nirasaki (JP); Yoshikazu Furusawa, Nirasaki (JP); Mitsuhiro Okada, Niraski (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/954,472

(22) Filed: Jul. 30, 2013

(65) Prior Publication Data

US 2014/0030879 A1    Jan. 30, 2014

(30) Foreign Application Priority Data

Jul. 30, 2012 (JP) ................................. 2012-168724
May 13, 2013 (JP) ................................. 2013-101309

(51) Int. Cl.
| H01L 21/223 | (2006.01) |
| H01L 21/324 | (2006.01) |
| H01L 21/322 | (2006.01) |
| H01L 21/22  | (2006.01) |
| H01L 21/67  | (2006.01) |

(52) U.S. Cl.
CPC ............. *H01L 21/22* (2013.01); *H01L 21/223* (2013.01); *H01L 21/67109* (2013.01)

(58) Field of Classification Search
CPC .................. H01L 21/02573; H01L 21/02579; H01L 21/0262; H01L 21/02636; H01L 21/22; H01L 21/31155; H01L 21/32155
See application file for complete search history.

(56) References Cited

U.S. PATENT DOCUMENTS

| 4,381,213 A * | 4/1983 | Flowers et al. ............... 438/558 |
| 5,268,062 A * | 12/1993 | Darling, Jr. ................... 427/122 |
| 6,548,378 B1 | 4/2003 | Boness et al. |
| 6,863,733 B1 * | 3/2005 | Tanabe .................... C23C 16/56 118/715 |
| 2009/0205567 A1 * | 8/2009 | Noda et al. ................... 118/668 |
| 2009/0324475 A1 * | 12/2009 | Kouvetakis et al. .......... 423/277 |

FOREIGN PATENT DOCUMENTS

| jp | 11-040570 | * | 2/1999 |
| JP | 11-87250 A | | 3/1999 |
| JP | 2000-82803 A | | 3/2000 |
| JP | 2000-340554 A | | 12/2000 |
| JP | 2002-533952 A | | 10/2002 |
| JP | 2012-69738 | | 4/2012 |
| KR | 10-2011-0090832 A | | 8/2011 |

* cited by examiner

*Primary Examiner* — Pamela E Perkins
(74) *Attorney, Agent, or Firm* — Nath, Goldberg & Meyer; Jerald L. Meyer (57) ABSTRACT

A method of vapor-diffusing impurities into a diffusion region of a target substrate to be processed using a dummy substrate is provided. The method includes loading the target substrate and the dummy substrate in a substrate loading jig, accommodating the substrate loading jig loaded with the target substrate and the dummy substrate in a processing chamber of a processing apparatus, and vapor-diffusing impurities into the diffusion region of the target substrate in the processing chamber having the accommodated substrate loading jig. The vapor-diffused impurities are boron, an outer surface of the dummy substrate includes a material having properties not allowing boron adsorption.

11 Claims, 12 Drawing Sheets

Evaluation Example 1: Silicon dummy wafer, without oxygen gas purge

FIG. 8

Evaluation Example 2: Silicon dummy wafer, with oxygen gas purge

FIG. 9

Evaluation Example 3: Silicon oxide dummy wafer, with oxygen gas purge

FIG. 10

Evaluation Example 4: Silicon oxide dummy wafer, without oxygen gas purge

METHOD OF VAPOR-DIFFUSING IMPURITIES

CROSS-REFERENCE TO RELATED APPLICATIONS

This application claims the benefit of Japanese Patent Application Nos. 2012-168724 and 2013-101309, filed on Jul. 30, 2012 and May 13, 2013, respectively, in the Japan Patent Office, the disclosure of which is incorporated herein in their entirety by reference.

TECHNICAL FIELD

The present disclosure relates to a method of vapor-diffusing impurities.

BACKGROUND

In a batch type heat processing apparatus, a heat processing method using a dummy wafer is used in order to maintain high in-plane uniformity and inter-plane uniformity and high reproducibility of heat processing even when an empty region where target substrates for processing are not loaded exists.

In the method, when there is an empty region, product wafers are maintained in a position biased upstream of a flow of processing gas while a dummy wafer is held in a position of directly downstream of the product wafer group. As a result, high in-plane and inter-plane uniformity may be obtained and high reproducibility of heat processing can be maintained even when there is an empty region.

Recently, with miniaturization of transistors, there is a need to more precisely control the amount of impurities being introduced. In the past, a minute variation of the amount of impurities being introduced has not presented a problem until now. However, if transistors were to be further miniaturized, even a slight variation of the amount of impurities being introduced may present a problem, for example, in a deviation of work function or a deviation of resistance value.

To use a dummy of a substrate to be processed, a so-called dummy wafer in a batch type heat processing apparatus is one of several effective methods for more precisely controlling the amount of introduced impurities. Through the use of a dummy wafer, it is possible to improve the in-plane uniformity of the amount of introduced impurities and the inter-plane uniformity between a plurality of product wafers of batch processing units, when compared with when the dummy wafer is not used.

However, in a case where impurities such as boron are vapor-diffused while the dummy wafer is used in the batch type heat processing apparatus, it was confirmed that although being very small, the amount of boron introduced into a product wafer was increased whenever the vapor diffusion was repeated. Accordingly, the use of a dummy wafer presented a new problem that it is difficult to obtain stability of the amount of introduced impurities between batch processing units.

SUMMARY

The present disclosure provides a method of diffusing impurities capable of obtaining stability of the amount of introduced impurities between batch processing units even in a case a dummy of a substrate to be processed is used.

According to the present disclosure, a method of vapor-diffusing impurities into a diffusion region of a target substrate to be processed using a dummy substrate, includes: loading the target substrate and the dummy substrate in a substrate loading jig; accommodating the substrate loading jig loaded with the target substrate and the dummy substrate in a processing chamber of a processing apparatus; and vapor-diffusing impurities into the diffusion region of the target substrate in the processing chamber having the accommodated substrate loading jig, wherein, when the vapor-diffused impurities are boron, an outer surface of the dummy substrate includes a material having properties not allowing boron adsorption.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Preparation of Monitor Wafer

Figure 1A:
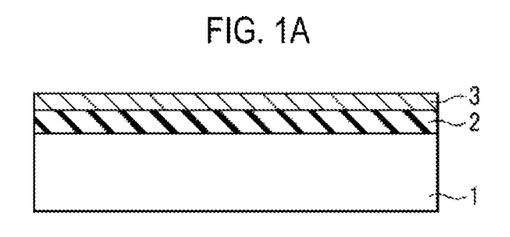
FIGS. 1A and 1B are sectional views showing an example of preparing a monitor wafer.
Figure 1B:
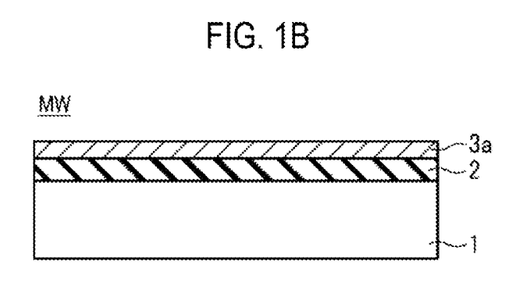

A monitor wafer simulating a product wafer is prepared. FIG. 1A and FIG. 1B are sectional views showing an example of preparing a monitor wafer. First of all, as shown in FIG. 1A, after a silicon oxide film 2 is formed on a silicon substrate 1, a non-doped amorphous silicon film 3 having a film thickness of 20 nm is formed by CVD using monosilane or disilane as a raw material gas.

Subsequently, as shown in FIG. 1B, the non-doped amorphous silicon film 3 is subjected to annealing at a temperature of 850 degrees C. for 30 minutes under a nitrogen atmosphere, and then, the non-doped amorphous silicon film 3 is crystallized, whereby a non-doped poly silicon film 3a is formed. In this way, a monitor wafer MW is prepared.

In the first embodiment, impurities such as boron are vapor-diffused into the non-doped poly silicon film 3a of the monitor wafer MW. The non-doped poly silicon film 3a is a diffusion region into which impurities are diffused.
<Cleaning of Monitor Wafer>

Before the vapor diffusion is performed, the monitor wafer MW is sufficiently cleaned. For this purpose, first, the monitor wafer MW is cleaned with dilute hydrofluoric acid having a concentration of 1% for 3 minutes. Then, the monitor wafer MW is washed with water for 10 minutes to sufficiently wash the dilute hydrofluoric acid away. Thereafter, the monitor wafer MW is washed with water for 10 minutes again. Subsequently, the monitor wafer MW is spin-dried for 10 minutes. Within 10 minutes after being spin-dried, the monitor wafer MW is loaded on a wafer boat and then is placed in a processing chamber of a heat processing apparatus.

As described above, before boron is vapor-diffused, the monitor wafer MW is sufficiently cleaned, and a period of time from the cleaning to the accommodation in the processing chamber is managed (i.e., the growth of a native oxide film is managed), thereby improving the precision and reliability in monitor evaluation, which will be described.
<Loading Monitor Wafer and Dummy Wafer>

Figure 2:
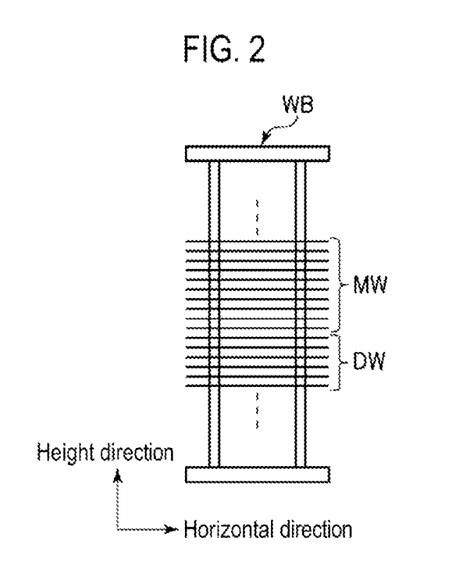
FIG. 2 is a sectional view showing an example of loading monitor wafers and dummy wafers onto a wafer boat.

FIG. 2 is a sectional view showing an example of monitor wafers and dummy wafers loaded on a wafer boat.

In the first embodiment, a plurality of the monitor wafers MW is prepared. As shown in FIG. 2, the plurality of monitor wafers MW that are sufficiently cleaned are loaded on a wafer boat WB of a substrate loading jig, which are stacked in a height direction. The height direction is a direction perpendicular to the horizontal direction, for example. Further, a plurality of dummy wafers DW is loaded in the wafer boat WB DW in addition to the plurality of monitor wafers MW. As a loading example, FIG. 2 shows an example that the plurality of monitor wafers MW are loaded in an upper part of the wafer boat WB while the plurality of dummy wafers DW are loaded in a lower part of the wafer boat WB.

In this manner, the plurality of monitor wafers MW and the plurality of dummy wafers DW loaded on the wafer boat WB are accommodated in the processing chamber, and boron is vapor-diffused into the non-doped poly silicon films 3a of the respective monitor wafers MW in the processing chamber at the same time.
<Evaluation of Monitor Wafer>

In order to evaluate the monitor wafers, the following four examples are performed.

Evaluation Example 1

Vapor Diffusion Temperature: 700 degrees C.
Vapor Diffusion Time: 60 minutes
Dummy Wafer: Silicon Dummy Wafer
Oxygen Gas Purge: Not performed
Under the above conditions, the boron vapor diffusion was consecutively performed on five batch processing units Run 1 to Run 5, and the dose amount of boron of the non-doped poly silicon film 3a was measured for each of the five batch processing units. In addition, while the silicon dummy wafers are not replaced, the monitor wafers MW were replaced for each batch processing unit.

Evaluation Example 2

Vapor Diffusion Temperature: 700 degrees C.
Vapor Diffusion Time: 60 minutes
Dummy Wafer: Silicon Dummy Wafer
Oxygen Gas Purge: Performed
Under the above conditions, the boron vapor diffusion was consecutively performed on three batch processing units Run 1 to Run 3, and the dose amount of boron of the non-doped poly silicon film 3a was measured for each of the three batch processing units. In addition, while the silicon dummy wafers are not replaced, the monitor wafers MW were replaced for each batch processing unit.

Evaluation Example 3

Vapor Diffusion Temperature: 700 degrees C.
Vapor Diffusion Time: 60 minutes
Dummy Wafer: Silicon Oxide Dummy Wafer
Oxygen Gas Purge: Performed
Under the above conditions, the boron vapor diffusion was consecutively performed on five batch processing units Run 1 to Run 5, and the dose amount of boron of the non-doped poly silicon film 3a was measured for each of the five batch processing units. In addition, while the silicon oxide dummy wafers are not replaced, the monitor wafers MW were replaced for each batch processing unit.

Evaluation Example 4

Vapor Diffusion Temperature: 700 degrees C.
Vapor Diffusion Time: 20 minutes
Dummy Wafer: Silicon Oxide Dummy Wafer
Oxygen Gas Purge: Not performed
Under the above conditions, the boron vapor diffusion was consecutively performed on five batch processing units Run 1 to Run 5, and the dose amount of boron of the non-doped poly silicon film 3a was measured for each of the five batch processing units. In addition, while the silicon oxide dummy wafers are not replaced, the monitor wafers MW were replaced for each batch processing unit.
<Process Recipe without Oxygen Gas Purge>

Figure 3:
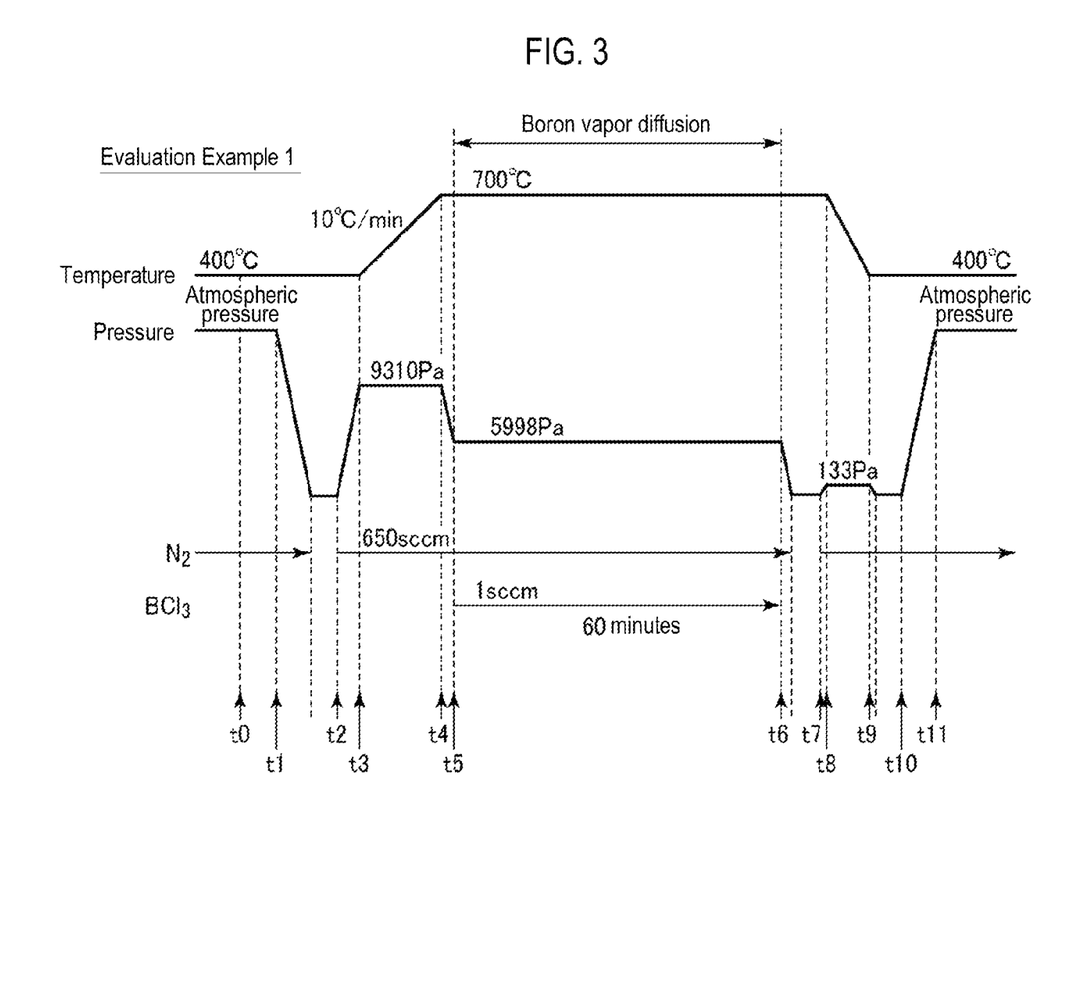
FIG. 3 is a timing chart showing an example of a process recipe without oxygen gas purge.

An example of a timing chart of a process recipe without oxygen gas purge is shown in FIG. 3.

As shown in FIG. 3, first, at a time t0, the wafer boat WB loaded with the monitor wafers MW and the dummy wafers DW is accommodated in the processing chamber. A load temperature when the wafer boat WB is accommodated is set, for example, to 400 degrees C.

Next, at a time t1, the processing chamber is vacuated by dropping the pressure in the processing chamber from atmospheric pressure.

Then, at a time t2, a flow rate of inert gas, e.g., a flow rate of nitrogen ($N_2$) gas in this example, which is supplied into the processing chamber, is set to 650 sccm, and the pressure in the processing chamber is increased from the vacuum pressure to 9310 Pa (about 70 Torr: 1 Torr is about 133 Pa).

Then, at a time t3, if the pressure in the processing chamber reaches 9310 Pa, the temperature in the processing chamber is allowed to increase from 400 degrees C. up to a vapor diffusion temperature of 700 degrees C. at a temperature increase rate of 10 degrees C./min.

Then, at a time t4, if the temperature in the processing chamber reaches 700 degrees C., the pressure in the processing chamber is allowed to drop from 9310 Pa to 5998 Pa (about 45.1 Torr).

Then, at a time t5, if the pressure in the processing chamber reaches 5998 Pa, impurity source gas, e.g., boron trichloride ($BCl_3$) gas in this example, is allowed to flow into the processing chamber at a flow rate of 1 sccm. In this manner, the boron vapor diffusion process is initiated.

Then, at a time t6, if the expected processing time of the boron vapor diffusion, e.g., 60 minutes in this example, elapses, the supply of the boron trichloride gas is stopped, and the boron vapor diffusion process is terminated. In addition, simultaneously with the termination of the boron vapor diffusion process, the processing chamber is vacuated by dropping the pressure in the processing chamber from 5998 Pa.

Then, at a time t7, the processing chamber is allowed to be supplied with nitrogen gas again, and simultaneously, the pressure in the processing chamber is allowed to increase from the vacuum pressure to 133 Pa (about 1 Torr).

Then, at a time t8, if the pressure in the processing chamber reaches 133 Pa, the temperature in the processing chamber is allowed to decrease from 700 degrees C. to an unload temperature, for example, of 400 degrees C.

Then, at a time t9, if the temperature in the processing chamber reaches 400 degrees C., the pressure in the processing chamber is allowed to decrease to 133 Pa, thereby vacuating the interior of the processing chamber.

Then, at a time t10, the pressure in the processing chamber is allowed to increase from the vacuum pressure to atmospheric pressure.

Then, at a time t11, if the pressure in the processing chamber reaches the atmospheric pressure, the wafer boat WB loaded with the monitor wafers MW and the dummy wafers DW is unloaded from the processing chamber.

In this way, the vapor diffusion processing on the monitor wafers MW based on an example of the process recipe without oxygen gas purge is terminated.

<Process Recipe with Oxygen Gas Purge>

Figure 4:
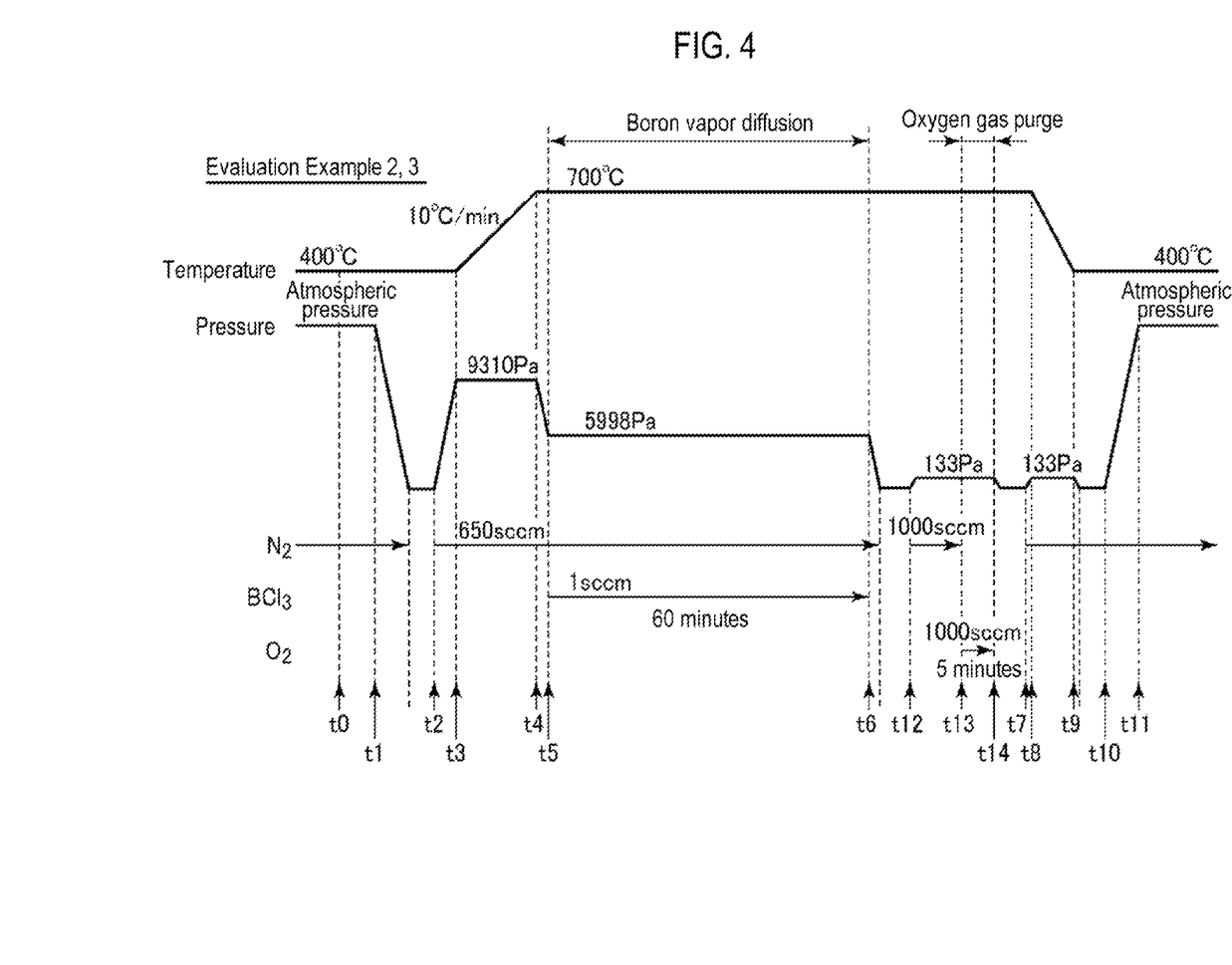
FIG. 4 is a timing chart showing an example of a process recipe with oxygen gas purge.

An example of a timing chart of a process recipe with an oxygen gas purge is shown in FIG. 4.

As shown in FIG. 4, the process recipe with an oxygen gas purge is equal to the process recipe without an oxygen gas purge until the time t6. The oxygen gas purge processing is added after the time t6.

First, at a time t12 after the time t6, the pressure in the processing chamber is allowed to increase from the vacuum pressure to 133 Pa, and at the same time, the processing chamber is allowed to be supplied with nitrogen gas at a flow rate of 1000 sccm. Accordingly, the interior of the processing chamber is purged with the nitrogen gas.

Then, at a time t13, if the expected processing time of nitrogen gas purge elapses, the supply of the nitrogen gas is stopped, and at the same time, the processing chamber is allowed to be supplied with oxygen ($O_2$) gas at a flow rate of 1000 sccm. Accordingly, the interior of the processing chamber is purged with the oxygen gas.

Then, at a time t14, if the expected processing time of the oxygen gas purge, e.g., five minutes in this example, elapses, the supply of the oxygen gas is stopped, and at the same time, the pressure in the processing chamber is allowed to decrease from 133 Pa to vacuumize the interior of the processing chamber.

Then, at a time t7, the processing chamber is supplied with nitrogen gas again, and simultaneously, the pressure in the processing chamber is allowed to increase from the vacuum pressure to 133 Pa (about 1 Torr). The processes thereafter are the same as those from the time t8 to the time t11 of the process recipe without an oxygen gas purge.

<Silicon Dummy Wafer and Silicon Oxide Dummy Wafer>

Figure 5:
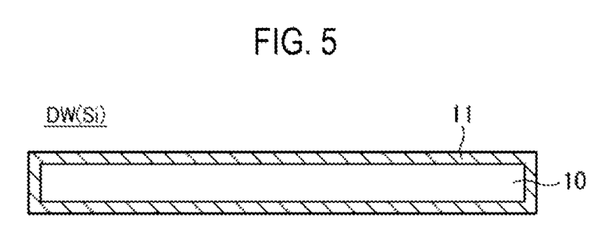
FIG. 5 is a sectional view showing an example of a silicon dummy wafer.
Figure 6:
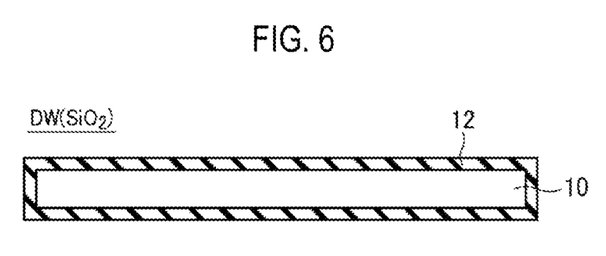
FIG. 6 is a sectional view showing an example of a silicon oxide dummy wafer.

FIG. 5 is a sectional view showing an example of a silicon dummy wafer, and FIG. 6 is a sectional view showing an example of a silicon oxide dummy wafer.

As shown in FIG. 5, in a silicon dummy wafer DW (Si), a non-doped amorphous silicon film 11 is formed on an outer surface of a silicon substrate 10. The non-doped amorphous silicon film 11 is formed by CVD using monosilane or disilane as a raw material gas, for example, like the non-doped amorphous silicon film 3 of the monitor wafer MW.

In addition, as shown in FIG. 6, in a silicon oxide dummy wafer DW ($SiO_2$), a silicon oxide film 12 is formed on an outer surface of the silicon substrate 10. The silicon oxide film 12 is formed on the outer surface of the silicon substrate 10 by CVD, for example, using TEOS (tetraethoxysilane) as a raw material gas or is formed by thermal oxidation of the outer surface of the silicon substrate 10.

<Evaluation Result>

Results of Evaluation Examples 1 to 4 are shown in FIGS. 7 to 10.

Result of Evaluation Example 1

Figure 7:
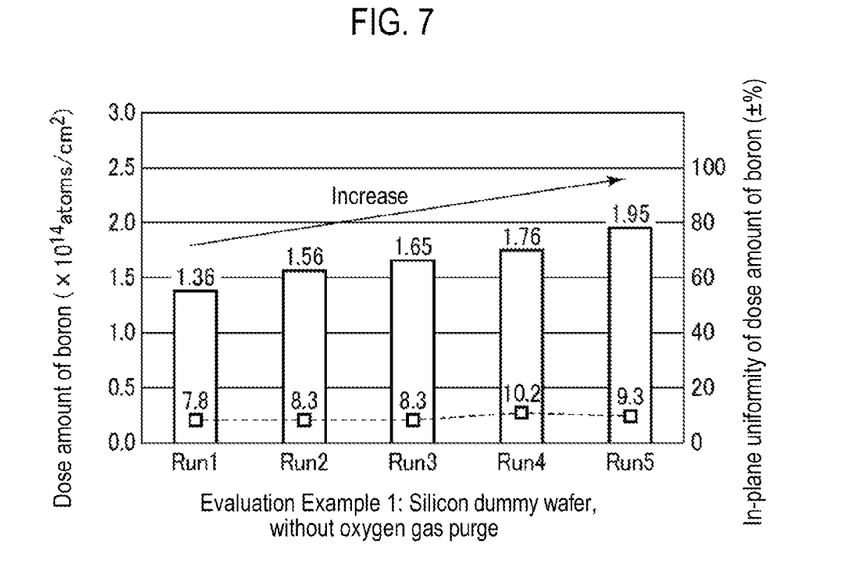
FIG. 7 is a view showing an evaluation result of Evaluation Example 1.

FIG. 7 shows a result of Evaluation Example 1. As shown in FIG. 7, in Evaluation Example 1, the dose amount of boron in the non-doped poly silicon film 3a is increased as the boron vapor diffusion is repeatedly performed on the initial batch processing unit Run 1, the second batch processing unit Run 2, . . . and the fifth batch processing unit Run 5.

In the evaluation result shown in FIG. 7, the dose amount of boron is increased from $1.36 \times 10^{14}$ atoms/cm$^2$ in the batch processing unit Run 1 up to $1.95 \times 10^{14}$ atoms/cm$^2$ in the batch processing unit Run 5.

Herein, the dose amount of boron is defined as the number of boron atoms per 1 cm$^2$. Intensity of X-ray fluorescence of boron in the non-doped poly silicon film 3a after the boron vapor diffusion was performed is measured using X-ray fluorescence analysis (XRF), and then the number of boron atoms was obtained from the measured intensity of X-ray fluorescence.

Result of Evaluation Example 2

Figure 8:
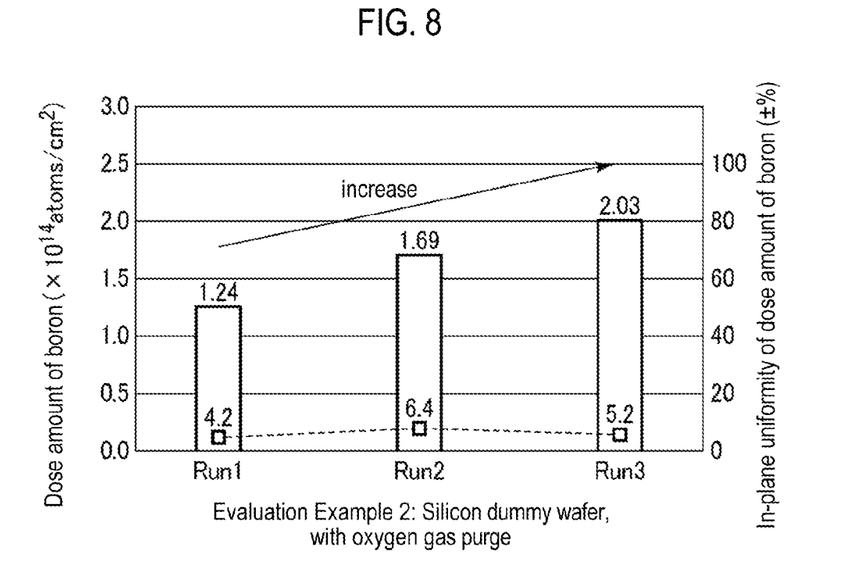
FIG. 8 is a view showing an evaluation result of Evaluation Example 2.

FIG. 8 shows a result of Evaluation Example 2.

As shown in FIG. 8, like the Evaluation Example 1, the dose amount of boron in the non-doped poly silicon film 3a is increased as the boron vapor diffusion is repeatedly performed on the initial batch processing unit Run 1, the second batch processing unit Run 2, and the third batch processing unit Run 3, in Evaluation Example 2.

In the evaluation result shown in FIG. 8, the dose amount of boron is increased from $1.24 \times 10^{14}$ atoms/cm$^2$ in the batch processing unit Run 1 up to $2.03 \times 10^{14}$ atoms/cm$^2$ in the batch processing unit Run 3.

In addition, Evaluation Examples 1 and 2 are different in whether or not the oxygen gas purge is performed. Although the in-plane uniformity of the dose amount of boron in Evaluation Example 1 in which the oxygen gas purge was not performed was 7.8 to 10.2%, the in-plane uniformity of the dose amount of boron in Evaluation Example 2 in which the oxygen gas purge was performed was 4.2 to 6.4%. It could be seen from the result that the oxygen gas purge caused an improvement of the in-plane uniformity of the dose amount of boron.

Also, Evaluation Examples 1 and 2 are the same in that the silicon dummy wafer DW (Si) shown in FIG. 5 is used as the dummy wafer DW. If the silicon dummy wafer DW (Si) is used, the dose amount of boron of the non-doped poly silicon film 3a tends to increase as the boron vapor diffusion is repeatedly performed.

On the basis of this knowledge, the dummy wafer DW was replaced with the silicon oxide dummy wafer DW (SiO$_2$) shown in FIG. 6 and then the evaluation was continued.

Result of Evaluation Example 3

Figure 9:
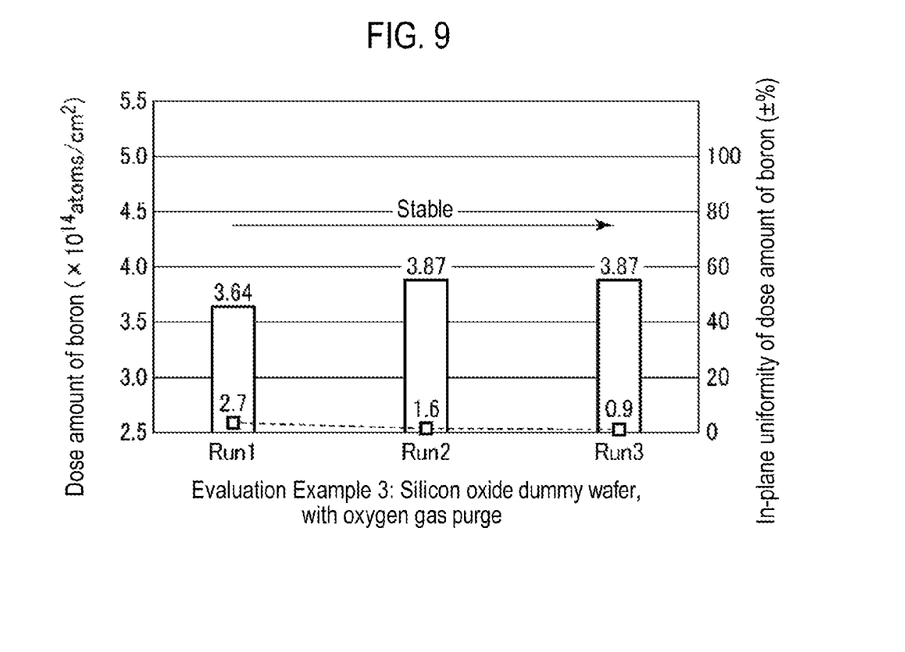
FIG. 9 is a view showing an evaluation result of Evaluation Example 3.

FIG. 9 shows a result of Evaluation Example 3.

As shown in FIG. 9, in Evaluation Example 3 in which the silicon oxide dummy wafer DW (SiO$_2$) was used as the dummy wafer DW, as compared with Evaluation Examples 1 and 2, the dose amount of boron in the non-doped poly silicon film 3a was stabilized over the initial batch processing unit Run 1, the second batch processing unit Run 2, and the third batch processing unit Run 3.

In the evaluation result shown in FIG. 9, the dose amount of boron was stabilized as follows:
Batch Processing Unit Run 1: $3.64 \times 10^{14}$ atoms/cm$^2$
Batch Processing Unit Run 2: $3.87 \times 10^{14}$ atoms/cm$^2$
Batch Processing Unit Run 3: $3.87 \times 10^{14}$ atoms/cm$^2$ By using the silicon oxide dummy wafer DW (SiO$_2$) as the dummy wafer DW in this way, it is possible to obtain the stabilization of the amount of introduced impurities, e.g., the dose amount of boron in this example, between the batch processing units Run 1 to Run 3.

In addition, the in-plane uniformity of the dose amount of boron was in a range of 0.9 to 2.7% and was more improved as compared with Evaluation Example 2 in which the oxygen gas purge is performed.

Also, although the boron vapor diffusion was performed under the same processing conditions as Evaluation Examples 1 and 2, i.e., at a vapor diffusion temperature of 700 degrees C. for a vapor diffusion time of 60 minutes, the dose amount of boron of the initial batch processing unit Run 1 increases about three times as compared with Evaluation Examples 1 and 2.

As a result of the Evaluation Example 3, in conclusion, considering that the dose amount of boron is stabilized between the batch processing units and that the dose amount of boron is increased under the same vapor diffusion conditions, it is possible to speculate that auto doping due to the silicon dummy wafer DW (Si) occurs in the processing chamber.

FIGS. 11A to 11D are sectional views showing an example of a model of auto doping.

Figure 11A:
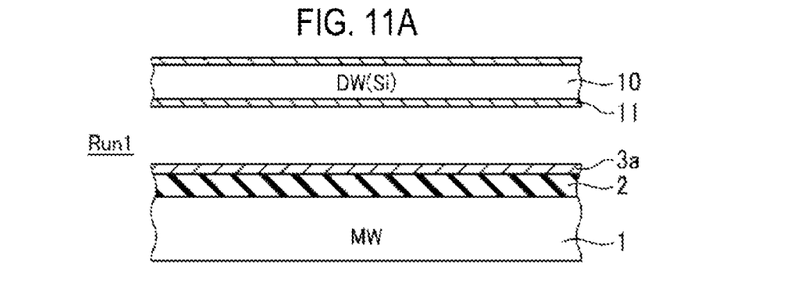
FIGS. 11A to 11D are sectional views showing an example of a model of auto doping.
Figure 11B:
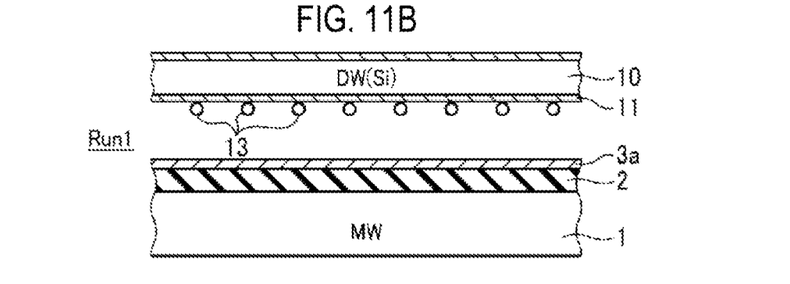

As shown in FIGS. 11A and 11B, if the boron vapor-diffusion is performed to the initial batch processing unit Run 1, boron 13 is adsorbed onto the surface of the silicon dummy wafer DW (Si).

Figure 11C:
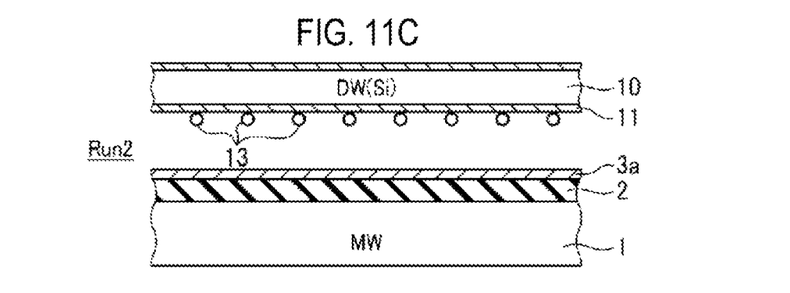
Figure 11D:
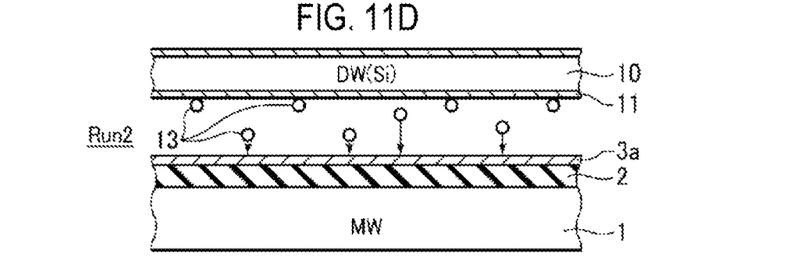

Then, as shown in FIGS. 11C and 11D, if the silicon dummy wafer DW (Si) having the boron 13 adsorbed thereto is used in the next batch processing unit Run 2 as it is, some of the boron 13 escape from the surface of the silicon dummy wafer DW (Si), and the escaped boron 13 is introduced into the non-doped poly silicon film 3a of the monitor wafer MW.

In this way, the boron 13 escaping from the surface of the silicon dummy wafer DW (Si) is again added to the impurity source gas such as boron trichloride gas supplied into the processing chamber, so that the dose amount of boron of the non-doped poly silicon film 3a in the batch processing unit Run 2 is increased as compared with the previous batch processing unit Run 1.

In regard to the auto doping due to the silicon dummy wafer DW (Si), it can be thought that no auto doping occurs in the silicon oxide dummy wafer DW (SiO$_2$) since no boron is adsorbed onto a surface thereof.

Therefore, surface compositions of the silicon dummy wafer and the silicon oxide dummy wafer after the boron vapor diffusion were examined using X-ray photoelectron spectroscopy (XPS).

Figure 12:
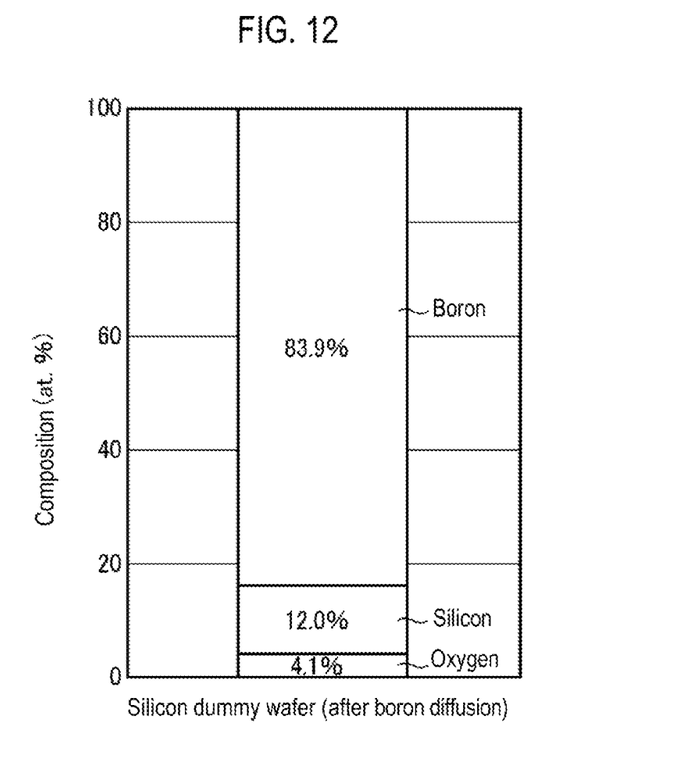
FIG. 12 is a view showing a result of examination of surface composition of a silicon dummy wafer after boron vapor diffusion.
Figure 13:
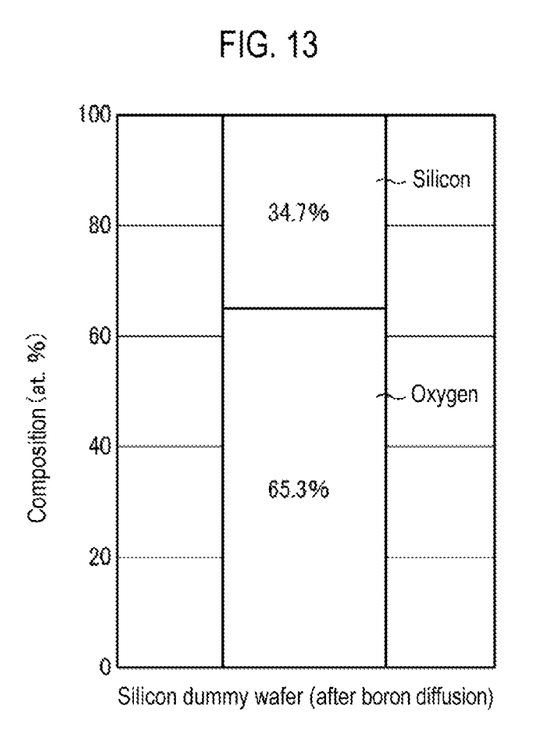
FIG. 13 is a view showing a result of examination of surface composition of a silicon oxide dummy wafer after boron vapor diffusion.

FIG. 12 is a view showing a result of examination of surface composition of a silicon dummy wafer after boron vapor diffusion, and FIG. 13 is a view showing a result of examination of surface composition of a silicon oxide dummy wafer after boron vapor diffusion.

As shown in FIG. 12, the silicon dummy wafer DW (Si) after the boron vapor diffusion had a surface composition of 83.9% boron, 12.0% silicon, and 4.1% oxygen. In this way, it can be seen that a ratio of boron to silicon of the surface of the silicon dummy wafer DW (Si) is about 7:1, and almost all the surface is covered with boron.

On the other hand, as shown in FIG. 13, the silicon oxide dummy wafer DW (SiO$_2$) after the boron vapor diffusion had a surface composition of 34.7% silicon and 65.3% oxygen, and no boron was detected. That is, it can be seen that the outer surface of the silicon oxide dummy wafer DW (SiO$_2$) is covered with the silicon oxide film 12 and no boron is adsorbed onto the surface of the silicon oxide film 12. In other words, the silicon oxide film 12 is a film having properties allowing boron not to be adsorbed thereto.

Therefore, using the silicon oxide dummy wafer DW (SiO$_2$) as the dummy wafer DW in the boron vapor-diffusion, like Evaluation Example 3, makes it possible to prevent the auto doping by using the dummy wafer DW. As a result, it is possible to obtain a method of diffusing impurities which may provide stability of the amount of introduced impurities between the batch processing units even when the dummy wafer DW is used.

Further, in Evaluation Example 3, boron contained in the impurity source gas such as boron trichloride gas supplied into the processing chamber is not consumed by the adsorption onto the surface of the silicon dummy wafer DW (Si). Accordingly, at the same time, it is possible to also obtain an effect that the dose amount per unit time of boron introduced into the non-doped poly silicon film 3a can be increased.

Result of Evaluation Example 4

In Evaluation Example 4, the following Considerations (1) and (2) were additionally performed on Evaluation Example 3 based on the knowledge from Evaluation Example 3.

Consideration (1): Considering that a good in-plane uniformity of the dose amount of boron is obtained in Evaluation Example 3, is it possible to obtain the good in-plane uniformity without the oxygen gas purge?

Consideration (2): Considering that the dose amount of boron per unit time is increased in Evaluation Example 3, is it possible to reduce the processing time of the boron vapor diffusion?

Figure 14:
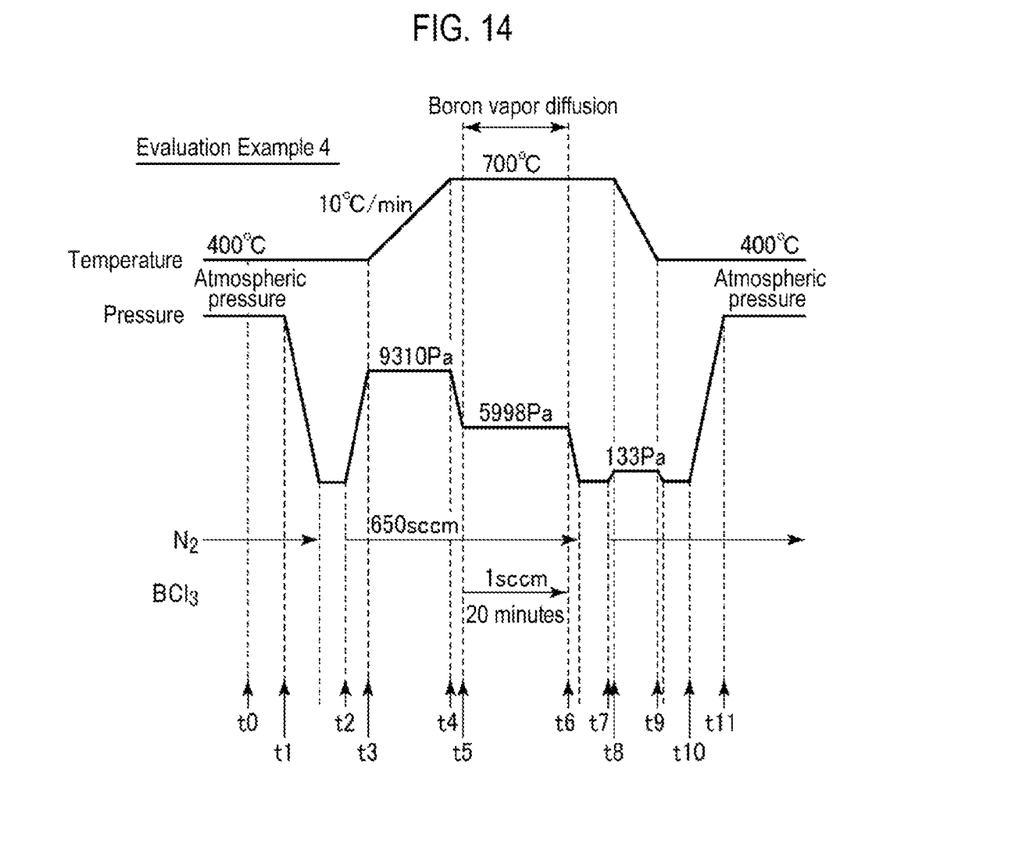
FIG. 14 is a timing chart showing an example of a process recipe of Evaluation Example 4.

FIG. 14 shows an example of a process recipe of Evaluation Example 4.

As shown in FIG. 14, considerations (1) and (2) are employed to reduce the boron vapor diffusion time to 20 minutes while no oxygen gas purge is performed, in Evaluation Example 4.

In addition, times t0 to t11 in FIG. 14 correspond to the times t0 to t11 described with reference to FIG. 3.

Figure 10:
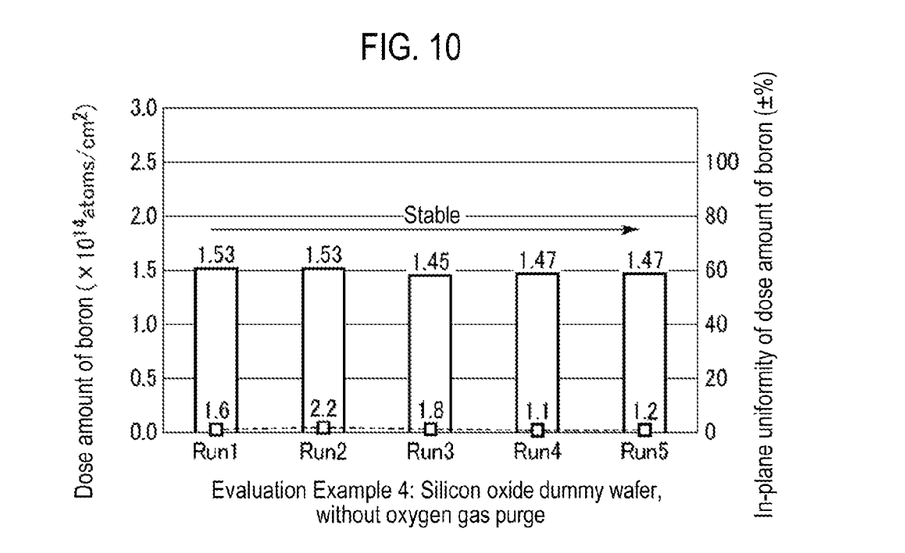
FIG. 10 is a view showing an evaluation result of Evaluation Example 4.

FIG. 10 shows a result of Evaluation Example 4.

As shown in FIG. 10, like Evaluation Example 3, the dose amount of boron of the non-doped poly silicon film 3a is stable between the batch processing units Run 1 to Run 5 in Evaluation Example 4.

Specifically, the dose amount of boron is as follows:
Batch Processing Unit Run 1: $1.53 \times 10^{14}$ atoms/cm$^2$
Batch Processing Unit Run 2: $1.53 \times 10^{14}$ atoms/cm$^2$
Batch Processing Unit Run 3: $1.45 \times 10^{14}$ atoms/cm$^2$
Batch Processing Unit Run 4: $1.47 \times 10^{14}$ atoms/cm$^2$
Batch Processing Unit Run 5: $1.47 \times 10^{14}$ atoms/cm$^2$ In addition, the in-plane uniformity of the dose amount of boron is 1.1 to 2.2%, and even though the oxygen gas purge is not performed, good in-plane uniformity is obtained as in Evaluation Example 3.

Accordingly, the oxygen gas purge is not unnecessary, and it is also possible to perform the oxygen gas purge in the same way as Evaluation Example 3 in order to obtain the better in-plane uniformity. On the contrary, for example, when reducing the processing time is needed in order to improve the throughput, it has been proven in Evaluation Example 4 that the oxygen gas purge can be omitted as in Evaluation Example 4. That is, it is possible to appropriately select whether or not to perform the oxygen gas purge.

Further, the vapor diffusion in Evaluation Example 4 was performed under the processing conditions of a vapor diffusion temperature of 700 degrees C. and a vapor diffusion time of 20 minutes as compared with Evaluation Examples 1 to 3 in which the vapor diffusion was performed at a vapor diffusion temperature of 700 degrees C. for a vapor diffusion time of 60 minutes. In this case, the vapor diffusion time was reduced to ⅓. In Evaluation Example 4, the dose amount of boron is $1.45 \times 10^{14}$ atoms/cm$^2$ to $1.53 \times 10^{14}$ atoms/cm$^2$, which is a value equal to or more than that of the initial batch processing unit Run 1 of Evaluation Examples 1 and 2 in which the vapor diffusion time is 60 minutes.

In Evaluation Example 4, since the silicon oxide dummy wafer DW (SiO$_2$) is used as the dummy wafer DW when boron vapor-diffusion is performed, it is possible to stabilize the dose amount of boron of the non-doped poly silicon film 3a between the batch processing units Run 1 to Run 5 as in Evaluation Example 3.

In addition, since the silicon oxide dummy wafer DW (SiO$_2$) is used, even though the oxygen gas purge is omitted, it is possible to maintain the good in-plane uniformity of the dose amount of boron.

Also, since no boron is adsorbed onto the silicon oxide dummy wafer DW (SiO$_2$) and thus no boron is consumed in the dummy wafer DW, it is possible to improve the dose amount of boron per unit time.

Accordingly, the vapor diffusion time for obtaining the desired dose amount of boron may be reduced as compared with Evaluation Examples 1 and 2 in which the silicon dummy wafer DW (Si) is used. As such, the throughput of the vapor diffusion processing may be improved. In addition, as described above, if the oxygen gas purge is omitted, it is also possible to obtain more improved throughput.

Second Embodiment

A second embodiment relates to a processing apparatus configured to perform the method of diffusing impurities in accordance with the first embodiment.

Figure 15:
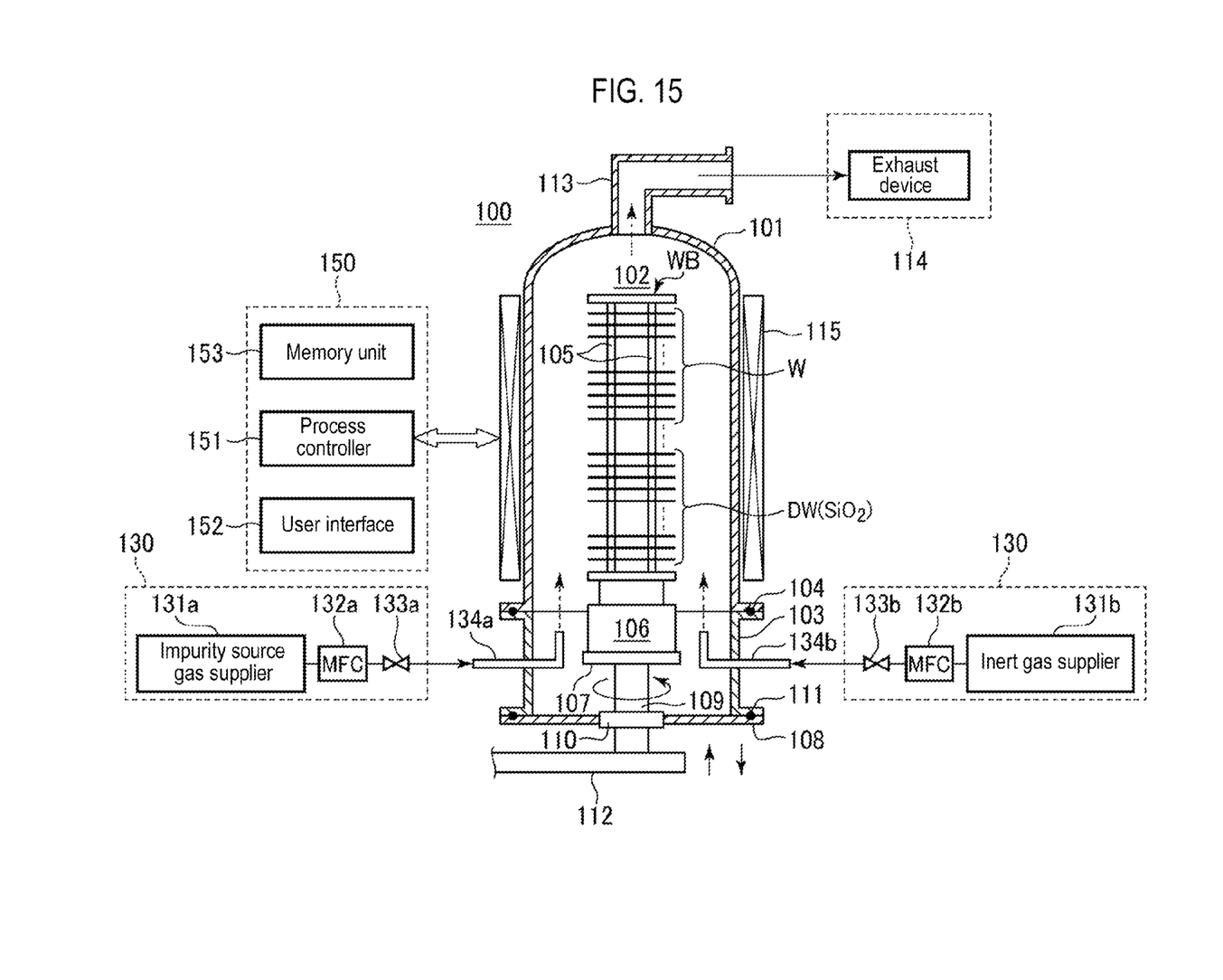
FIG. 15 is a sectional view schematically showing an example of a batch type vertical heat processing apparatus capable of performing the method of diffusing impurities according to the first embodiment.

FIG. 15 is a sectional view schematically showing an example of a batch type vertical heat processing apparatus capable of performing the method of diffusing impurities in accordance with the first embodiment.

As shown in FIG. 15, a batch type vertical heat processing apparatus (hereinafter, referred to as a heat processing apparatus) 100 has a cylindrical outer wall 101 having a ceiling. The outer wall 101 is made, for example, of quartz, and the interior of the outer wall 101 is defined as a processing chamber 102, in which a plurality of objects to be processed are accommodated and a heat processing is performed in a batch. In this example, a semiconductor wafer W such as a silicon wafer is illustrated as an example of the object to be processed, and the batch heat processing, e.g., the vapor diffusion processing of impurities in this example, on the semiconductor wafers W is performed in the processing chamber 102. An example of the impurity may be boron as described in the first embodiment. In addition, the semiconductor wafer W corresponds to the monitor wafer MW described in the first embodiment.

A lower end of the outer wall 101 is defined by an opening, and a cylindrical manifold 103 is connected to the opening. The manifold 103 is made, for example, of stainless steel. The lower end of the outer wall 101 and an upper end of the manifold 103 are connected to each other via a seal member 104 such as an O-ring. A lower end of the manifold 103 is defined as an opening, through which a wafer boat WB is inserted into the processing chamber 102. The wafer boat WB is made, for example, of quartz and has a plurality of pillars 105. Each of the pillars 105 has grooves (not shown) formed therein, and a plurality of the semiconductor wafers W and, for example, a plurality of the silicon oxide dummy wafers DW (SiO$_2$) is supported by the grooves together. In this manner, the wafer boat WB can allow a plurality of sheets, for example 50 to 150 sheets, of the semiconductor wafers W and silicon oxide dummy wafers DW (SiO$_2$) to be loaded in a multistage manner.

The wafer boat WB is mounted on a table 107 via a heat insulation container 106 made of quartz. The table 107 is supported on a rotating shaft 109 extending through a lid portion 108 made of, for example, stainless steel. The lid portion 108 opens and closes the lower end opening of the manifold 103. A part of the lid portion 108 through which the rotating shaft 109 extends, for example, is equipped with a magnetic fluid seal 110 to air-tightly seal and rotatably support the rotating shaft 109. In addition, a sealing member 111 such as an O-ring is mounted between a periphery of the lid portion 108 and the lower end of the manifold 103 to maintain sealing in the processing chamber 102. The rotating shaft 109 is mounted to a leading end of an arm 112 supported by a lift mechanism (not shown) such as a boat elevator. With this configuration, the wafer boat WB, the lid portion 108 and the like are lifted up or down in the vertical direction together so that they can be inserted into or separated from the processing chamber 102.

An exhaust pipe 113 is connected to the ceiling of the outer wall 101. The exhaust pipe 113 is connected to an exhaust device 114. The exhaust device 114 includes a vacuum pump or the like (not shown) and serves to allow the gas used in the heat processing to be exhausted from the interior of the processing chamber 102 and also to adjust the pressure in the processing chamber 102 to a pressure suitable for the processing.

A heating device 115 is provided outside the outer wall 101 to surround the processing chamber 102. The heating device 115 adjusts the temperature in the processing chamber 102 to a temperature suitable for the processing and heats the objects to be processed, i.e., the plurality of the semiconductor wafers W in this example.

The heat processing apparatus 100 has a processing gas supply mechanism 130 for supplying gases used in the heat processing to the processing chamber 102.

In this example, the processing gas supply mechanism 130 includes an impurity source gas supplier 131a, and an inert gas supplier 131b. In this example, boron trichloride ($BCl_3$) gas is used as the impurity source gas. In addition, nitrogen ($N_2$) gas is used as the inert gas. The impurity source gas is used in the vapor diffusion processing described in the first embodiment, whereas the inert gas is used as a purge gas for the purge process, or as a dilution gas in the vapor diffusion processing.

The impurity source gas supplier 131a is connected to a gas supply port 134a via a mass flow controller (MFC) 132a and an opening/closing valve 133a. In the same manner, the inert gas supplier 131b is connected to a gas supply port 134b via a mass flow controller (MFC) 132b and an opening/closing valve 133b. Each of the gas supply ports 134a and 134b is formed to extend through a sidewall of the manifold 103 in the horizontal direction and diffuse the supplied gas toward the interior of the processing chamber 102 above the manifold 103.

A control unit 150 is connected to the heat processing apparatus 100. The control unit 150 includes a process controller 151 implemented with, e.g., a microprocessor (computer), which controls each component of the heat processing apparatus 100. A user interface 152 and a memory unit 153 are connected to the process controller 151.

The user interface 152 is provided with an input unit including a keyboard or a touch panel display for an operator to perform an input operation of commands and the like to manage the heat processing apparatus 100, and a display unit including a display for visualizing and displaying the operating status of the heat processing apparatus 100.

The memory unit 153 stores a so-called process recipe including a control program for implementing various kinds of processing performed in the heat processing apparatus 100 by the control of the process controller 151 and a program for performing the processes in the respective components of the heat processing apparatus 100 under particular processing conditions. The storage medium may be a portable memory, such as a CD-ROM, DVD, or flash memory, as well as a hard disk or semiconductor memory. In addition, the process recipe may be suitably transmitted from other units, for example, through a dedicated line.

The process recipe, if necessary, is read from the memory unit 153 by operator's instructions or the like from the user interface 152, and the processing pursuant to the read process recipe is performed by the process controller 151, so that the required processing is performed in the heat processing apparatus 100 by the control of the process controller 151. In this example, under the control of the process controller 151, the method of diffusing impurities described in the first embodiment is performed in the heat processing apparatus 100. In this example, the processing gas supply mechanism 130 has no oxygen gas supplier. Therefore, the heat processing apparatus 100 shown in FIG. 15 performs the processing in accordance with Evaluation Example 4 of the first embodiment. Especially, although not shown, if the processing gas supply mechanism 130 is provided with the oxygen gas supplier, the processing in accordance with the Evaluation Example 3 of the first embodiment can be performed.

The method of diffusing impurities in accordance with the first embodiment may be performed, for example, in the batch type vertical heat processing apparatus 100 as shown in FIG. 15.

Although the present disclosure has been described according to the first and second embodiments, the present disclosure is not limited to the first and second embodiments, and various modifications may be made within the scope without departing from the spirit of the present disclosure.

For example, although the processing conditions have been specifically exemplified in the first embodiment, the processing conditions are not limited to the aforementioned specific examples but may be suitably modified.

Further, although the batch type vertical heat processing apparatus has been exemplified in the second embodiment, the method of diffusing impurities according to the first embodiment may be performed in batch type film forming apparatuses other than the vertical type.

In addition, although the non-doped poly silicon film 3a has been exemplified as a diffusion region where the diffusion of impurities occurs, i.e., a film into which impurities are diffused, in the first embodiment, the film where the diffusion of impurities occurs may be not only a non-doped amorphous silicon film but also a non-doped single crystal silicon film.

When the diffusion region is, for example, a semiconductor material such as silicon, the semiconductor material may be in either an "amorphous" state or a "crystalline" state. In addition, when a semiconductor material is in a "crystalline" state, the "crystal" may be either "single crystal" or "poly crystal."

In addition, the diffusion region is also not limited to a non-doped material, and may be material containing impurities therein. In this case, impurities are further diffused into the diffusion region.

Further, the diffusion region is not limited to a film such as the non-doped poly silicon film 3a, and a substrate to be processed itself, for example, the semiconductor wafer W (the silicon substrate 1) itself may be the diffusion region.

Furthermore, in the first embodiment, the silicon oxide dummy wafers DW ($SiO_2$) having the outer surface covered with the silicon oxide film was used as the dummy wafer DW. However, the dummy wafer DW is not limited to the dummy wafer having the outer surface covered with the silicon oxide film. As the dummy wafer DW, any kind of dummy wafers can enjoy the same advantages as aforementioned in the first embodiment, if it has an outer surface covered with a film having properties not allowing boron adsorption thereto. That is, even though the dummy wafer DW is used in the vapor diffusion of boron, it is possible to stabilize the amount of introduced impurities between batch processing units.

A material of which the film having properties not allowing boron adsorption is made thereto may include, for example nitride in addition to the oxide described in the first embodiment.

An example of the oxide may include, for example, metal oxide, in addition to the silicon oxide described in the first embodiment.

An example of the nitride may include silicon nitride.

In addition, although the silicon substrate 10 was used as the substrate of the dummy wafer DW in the first embodiment, a SiC substrate, a compound semiconductor substrate or the like may be used in addition to the silicon substrate 10. In such a case, the outer surface of the non-silicon substrate such as a SiC substrate or a compound semiconductor substrate is covered with a film having properties not allowing boron adsorption thereto. To this end, for example, an oxide (e.g., CVD silicon oxide and CVD metal oxide) or a nitride (e.g., CVD silicon nitride) is deposited on the outer surface of the substrate other than the silicon substrate. In this way, the outer surface of the substrate other than the silicon substrate need to be covered with a film having properties not allowing boron adsorption thereto.

Figure 16:
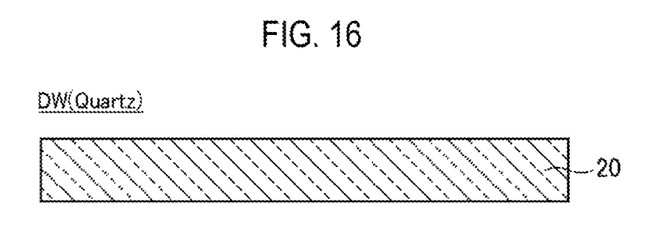
FIG. 16 is a sectional view showing an example of a quartz substrate used as a dummy wafer.

In addition, it is possible to use a quartz substrate as the dummy wafer DW. Shown in FIG. 16 is an example of a quartz substrate used as the dummy wafer DW (Quartz). Quartz is silicon oxide. For this reason, as shown in FIG. 16, an outer surface of a quartz substrate 20 consists of a material having properties not allowing boron adsorption thereto. Therefore, in the dummy wafer DW (Quartz) using the quartz substrate 20, it is not necessary to cover the surface thereof with a film having properties not allowing boron adsorption thereto.

As described above, although it is possible to allow the outer surface of the dummy wafer DW to be covered with a film with properties not allowing boron adsorption thereto, it is also possible the entirety of the dummy wafer DW to be formed of a material having properties not allowing boron adsorption thereto, e.g., the quartz substrate 20 of the dummy wafer DW (Quartz).

In addition, in the heat processing apparatus described in the second embodiment, it is preferred that components in the processing chamber exposed to the interior of the processing chamber have an outer surface covered with an oxide such as silicon oxide or metal oxide or a nitride such as silicon nitride, except that components in the processing chamber including a process tube corresponding to the outer wall 101, the wafer boat WB, the heat insulation container 106 and the like as representative examples, are made of quartz. Covering the components inside the processing chamber with the oxide can prevent the auto doping due to the material of the components in the processing chamber, thereby making it possible to improve stability of the amount of introduced impurities between batch processing units.

The present disclosure provides a method of diffusing impurities capable of obtaining stability of the amount of introduced impurities between batch processing units even in a case a dummy of a substrate to be processed is used.

While certain embodiments have been described, these embodiments have been presented by way of example only and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of vapor-diffusing impurities into a diffusion region of a target substrate to be processed using a dummy substrate, comprising:
    loading the target substrate in an upper part of a wafer boat and the dummy substrate in an lower part of the wafer boat in a substrate loading jig;
    accommodating the substrate loading jig loaded with the target substrate and the dummy substrate in a processing chamber of a processing apparatus; and
    vapor-diffusing impurities into the diffusion region of the target substrate in the processing chamber having the accommodated substrate loading jig,
    wherein, when the vapor-diffused impurities are boron, an outer surface of the dummy substrate includes a material having properties not allowing boron adsorption, and
    wherein the material having properties not allowing boron adsorption is selected from any one of oxide and nitride.

2. The method of claim 1, wherein the loading, the accommodating, and the vapor-diffusing are performed on the target substrate and the dummy substrate in a batch processing unit, and in a subsequent batch processing unit, the loading, the accommodating, and the vapor-diffusing are performed on a subsequent target substrate and the dummy substrate from the batch processing unit.

3. The method of claim 1, wherein after vapor-diffusing the impurities, an oxygen gas purge is performed.

4. The method of claim 1, wherein after vapor-diffusing the impurities, performing the method is completed without performing oxygen gas purge.

5. The method of claim 1, wherein the oxide is selected from any one of silicon oxide and metal oxide.

6. The method of claim 1, wherein the nitride includes silicon nitride.

7. The method of claim 1, wherein the dummy substrate is made of quartz.

8. The method of claim 1, wherein the diffusion region of the target substrate is made of a semiconductor material, and in vapor-diffusing the impurities, boron is vapor-diffused into the semiconductor material.

9. The method of claim 8, wherein the semiconductor material is in any one of an amorphous state and a crystalline state.

10. The method of claim 9, wherein when the semiconductor material is in the crystalline state, the crystal is in any one of a single crystalline state and a poly crystalline state.

11. The method of claim 1, wherein boron trichloride gas is used in vapor-diffusing the impurities in a form of an impurity source gas.

* * * * *